United States Patent [19]

Eysermans

[11] 4,048,670
[45] Sept. 13, 1977

[54] STRESS-FREE HALL-CELL PACKAGE

[75] Inventor: Hubert Eysermans, Wichita Falls, Tex.

[73] Assignee: Sprague Electric Company, North Adams, Mass.

[21] Appl. No.: 591,684

[22] Filed: June 30, 1975

[51] Int. Cl.² ............................................... H05K 1/04
[52] U.S. Cl. ................................. 361/421; 174/52 PE
[58] Field of Search ........................ 317/101 C, 101 R; 174/52 PE; 357/72, 26; 29/588; 361/421

[56] References Cited

U.S. PATENT DOCUMENTS

| | | | |
|---|---|---|---|
| 2,906,931 | 9/1959 | Armstrong | 357/72 |
| 2,915,684 | 12/1959 | Halla et al. | 357/26 |
| 3,441,813 | 4/1969 | Takatsuka et al. | 357/72 |
| 3,568,012 | 3/1971 | Ernst et al. | 357/72 |
| 3,659,164 | 4/1972 | Gaylor | 357/72 |
| 3,689,864 | 9/1972 | Ishihama et al. | 174/52 PE |
| 3,706,840 | 12/1972 | Moyle | 29/588 |
| 3,742,599 | 7/1973 | Desmond et al. | 357/72 |
| 3,778,685 | 12/1973 | Kennedy | 357/72 |
| 3,820,237 | 6/1974 | Effer | 29/588 |

*Primary Examiner*—David Smith, Jr.

*Attorney, Agent, or Firm*—Connolly and Hutz

[57] ABSTRACT

A thin stress-free hall-cell package includes a semiconductor hall-cell chip that is completely enveloped by a resilient cushioning material which is in turn held within a cup. The cup is attached to or is a part of at least one of the metal leads. Wires connect the leads to terminal-pads on the chip through the resilient cushioning material. The method for making the package includes providing support for the cup by one or more of the leads, placing the chip in the cup, dispensing a silicone resin into the cup and heat curing the resin. The package is completed with encapsulation of the cup and adjacent lead ends by a hard resin. The cup advantageously has a hole in its bottom such that a chip placed thereover is held in position for wire bonding by evacuating the hole from underneath by means of a vacuum system. A hot pin is then inserted in the hole to elevate the chip, the pin is retracted to be about flush with the inside of the cup bottom and liquid resin dispersed therein and completely envelops the chip. The resin cures locally about the hot pin. The pin is removed and the resin is completely cured in an oven.

7 Claims, 8 Drawing Figures

STRESS-FREE HALL-CELL PACKAGE

BACKGROUND OF THE INVENTION

This invention relates to packages for hall-cells and more particularly to stress-free packages for hall-cells of the semiconductor type.

In addition to the protection from physical damage and from moisture and contaminants that is afforded a standard semiconductor device by a conventional package, the package of a semiconductor type hall-cell should meet other special criteria as well. The sensitivity of such hall-cells is subject to change with any physical force that may tend to distort or stress the semiconductor chip. Furthermore it is often desirable to locate the hall-cell as closely as possible to the source of magnetic field that it is intended to sense. Thus the package should additionally exert no stresses on the semiconductor hall-cell either by transmitting such forces or by differential expansion or contraction resulting from temperature changes therein, and the protective housing enclosing the chip should be thin.

A stress-free package for such a hall-cell would eliminate a major source in conventional packages of changes in hall-cell sensitivity with temperature and permit application of known techniques for temperature compensation within the chip (e.g. the integrated circuit with a hall-cell as described in U.S. Pat. No. 3,816,766 issued June 11, 1974) to produce a packaged hall-cell with a near zero temperature coefficient of sensitivity.

Conventional packages typically include a die-bonded connection between the chip and a metal or metallized supporting substrate, and differential coefficients of expansion with temperature of the semiconductor and the substrate are unavoidable. Conventional resin encapsulated packages are usually chosen to house hall-cells since they may provide a thin covering, enabling close placement of the hall-cell to a source of a magnetic field. However, hard resin coatings in contact with the encapsulated hall-cell tend to produce large physically distorting forces on the hall-cell.

It is therefore an object of this invention to provide a stress-free package suitable for housing a hall-cell.

It is another object of this invention to provide a hall-cell package having a uniformly thin protective covering over the hall-cell.

It is yet another object of this invention to provide a method for manufacturing a thin walled stress-free hall-cell package, wherein good control is maintained in the physical registration of the package elements during assembly.

SUMMARY OF THE INVENTION

A stress-free hall-cell package includes a hall-cell formed in a semiconductor chip, which chip may also have an integrated circuit amplifier and other functional circuits incorporated and interconnected therein. Electrical access for powering the hall-cell and for detecting the output of the hall-cell is provided through terminal pads on a surface of the chip. The package has lead wires, each such lead being connected by a wire to one of the terminal pads. The chip is completely encompassed by an elastomeric material which is in turn contained in a cup. The cup and near end portion of the leads are encapsulated by a supporting housing, preferably of a molded resin material.

A method for making the stress-free package of this invention includes supporting a cup by at least one of the leads. This may be accomplished by forming a flange at the mouth or rim of the cup that rests on two adjacent leads or alternatively forming the cup in an extended portion of one of the leads. According to one procedure, a small quantity of an uncured liquid insulative compound, such as silicon rubber, is dispensed into the bottom of the cup, the chip with wires attached to the pads is placed on top of the dispensed liquid and another quantity of the liquid compound is dispensed over the chip. The compound is then cured as by heating. The flying wires are then attached one to each lead. In a particularly advantageous procedure for providing the encompassing elastomeric compound about the chip, the chip without attached wires is placed in the cup. Wires are now bonded to the terminal pads and to the leads. The chip may be lifted away from the bottom of the cup and held suspended by the wires so that the liquid compound may be dispensed into the cup to completely encompass the chip. In yet another refinement, a hole is provided in the bottom of the cup and the chip without wires is placed in the cup. The chip is held firmly in the bottom of the cup by pressing a vacuum line to the outer bottom of the cup over the hole, and the wires are attached, as by ultrasonic or thermal compression bonding to the pads and to the leads. A pin is inserted through the hole in the cup to slightly lift the chip away from the cup. The liquid compound is dispensed into the cup. The pin is heated during dispensing and withdrawn about flush within the hole so as to locally quick cure the liquid compound in the vicinity of the hole and prevent uncured liquid from flowing out. The liquid compound is then completely cured by heating the assembly. Finally the assembly is encapsulated as by molding or by casting with an epoxy resin.

The use of the cup of this invention aids in the control of the application of a thin but uniform coating of elastomeric compound about the chip. The inclusion of the cup that is abutting and supportable by at least one of the leads, according to this invention, provides accurate placement of the elastomer coated chip relative to the leads which enhances control of a thin uniform encapsulation about the coated chip. A thin uniform encapsulation is especially advantageous for housing a hall-cell element so as to allow its close placement to sources of magnetic fields and thus effectively maximizing its sensitivity.

DESCRIPTION OF THE PREFERRED EMBODIMENTS

Figure 1:
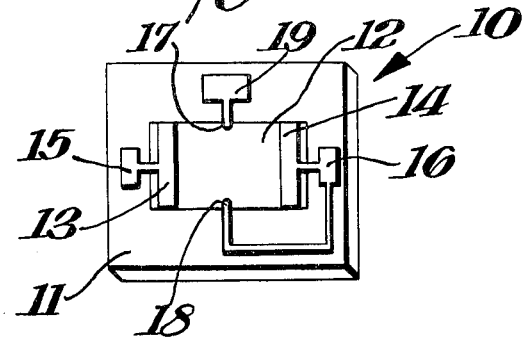
FIG. 1 shows a conventional silicon crystal wafer or chip having a hall-cell formed therein.

An integrated hall-cell circuit 10 of FIG. 1 comprises a semiconducting silicon chip or wafer 11 having a shallow doped region 12 in a surface thereof that serves as the body of a hall-cell. Two broad metal contacts 13 and 14 make ohmic connection to opposite ends of the body region 12 and are electrically connected to two terminal pads 15 and 16, respectively. Two metal contacts 17 and 18 make ohmic connection to the approximate center of the two opposite edges of the region 12 and are electrically connected to a third terminal pad 19 and the above noted pad 16, respectively. As is well known, when an electrical potential is applied between terminal pads 15 and 16, and a magnetic field is present having a component orthogonal to the plane of the hall-cell body 12 and thus to the major surface of the chip 11, a voltage appears between terminal pads 16 and 19 having a magnitude that is directly related to the strength of the orthogonal component of magnetic field.

Figure 2:
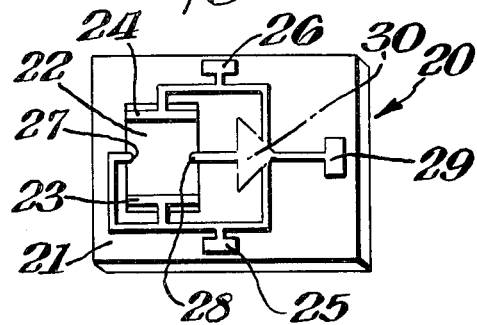
FIG. 2 illustrates a conventional silicon crystal wafer having a hall-cell and an associated integrated circuit formed therein.

The integrated circuit 20 shown in FIG. 2 is formed in a semiconductor wafer 21 and includes a hall-cell similar in construction to that of FIG. 1. The hall-cell body 22 is connected at the top and bottom ends by metal contacts 23 and 24 that are electrically connected to terminal pads 25 and 26, respectively. The sensing contact 27 is also electrically connected to terminal pad 25. An integrated circuit amplifier 30 is formed in another surface region of the wafer 21, being shown diagrammatically by a dashed line of conventional triangular shape. The sensing contact 28 is electrically connected to the input of the amplifier 30 while the amplifier output is connected to a third terminal pad 29. The amplifier additionally has electrical connections made thereto from terminal pads 26 and 25. A suitable d.c. voltage being applied between terminal pads 25 and 26 supplies the necessary energy for powering both the hall-cell and the amplifier. Now when a magnetic field produces a voltage between the sensing contacts, an amplified replica of that hall-cell voltage appears between terminal pads 25 and 29.

Thus the circuit 20 and the circuit 10 are functionally the same, the latter having a greater sensitivity, and both circuits have three terminal pads providing electrical access to a hall-cell. In general integrated magnetic sensing circuits having a hall-cell are known that include other integrated circuit portions such as threshold detectors, voltage regulators, temperature compensating circuits, etc. The integrated hall-cell circuits of FIGS. 1 and 2 are merely exemplary of such magnetic sensing components that are properly subject to being packaged according to the principles of this invention.

Figure 3:
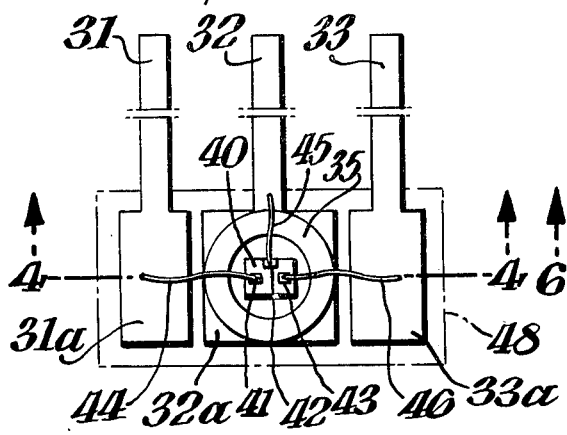
FIG. 3 shows a top view of a partially assembled hall-cell package of this invention.
Figure 4:
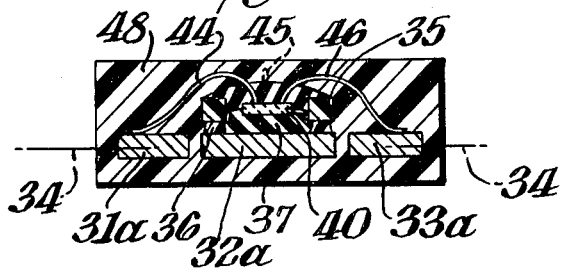
FIG. 4 shows an end sectional view of the completed package of FIG. 3 taken in plane 4—4.

A top view of a hall-cell package, representing a first preferred embodiment, is shown partially completed for clarity in FIG. 3. FIG. 4 shows this package completed and in both figures each element is identified by the same numeral. Three flat metal leads 31, 32 and 33, lying in a common plane 34, have rectangular cross sections and are most conveniently made by stamping, etching or otherwise cutting them from a sheet of copper alloy, such as Alloy 42, or from a sheet of KOVAR, a Tradename for an expansion alloy made by Westinghouse Electric Corp., Blairsville, Pa.

The leads may conveniently extend from and still be connected to a common strip of the parent sheet metal during all of the steps required for forming the package of this invention. The lower ends (as shown in FIG. 3) of the leads 31, 32 and 33 have wide portions 31a, 32a and 33a. A ring 35 of insulating material such as ceramic, epoxy or a fluorocarbon resin is bonded to lead portion 32a so as to form a cup with lead portion 32a becoming the bottom of the cup. The ring to cup bonding agent 36 may be an epoxy or any other suitable bonding material. A hall-cell wafer 40 has terminal pads 41, 42 and 43 to provide electrical access to the hall-cell as was explained in connection with the integrated circuit hall-cell chips of FIGS. 1 and 2.

A layer 37 of a compliant or resilient material such as foamed polyurethane or silicon rubber is positioned in the cup at the bottom. The hall-cell chip 40 is positioned within the cup on the layer 37 and wires 44, 45 and 46 each have an end that has been bonded to pads 41, 42 and 43, respectively. The other end of the wires 44, 45 and 46 are bonded to lead portions 31a, 32a and 33a, respectively. The wire bonding to the pads is conveniently accomplished by thermo compression bonding or by ultrasonic bonding as are well known. The wire to lead bonds may be made by the same methods or by another welding method. The wire to lead bonds preferably lie essentially in one plane as indicated, which plane is parallel to the plane of the hall-cell so as to achieve a thin hall-cell package.

A layer 45 of a compliant or resilient material overlies the wafer 40 within the cup. The resilient layers 37 and 45 completely envelop the wafer, providing physical support while insulating it from differential forces that might otherwise be imposed by the housing encapsulant within the completed package. Finally a housing 48 encloses the cushioned chip and the wide end portions of the leads. The outline of the housing 48 is indicated in FIG. 3 by a dashed line. The housing 48 may be cast of a thermosetting material such as an epoxy, or alternatively may be injection molded using a thermoplastic material such as polypropylene.

Figure 5:
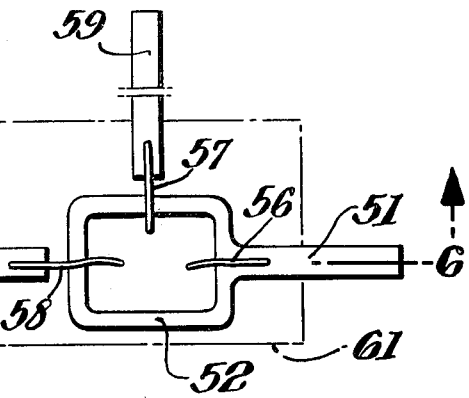
FIG. 5 shows a top view of another hall-cell package of this invention with the housing material removed.
Figure 6:
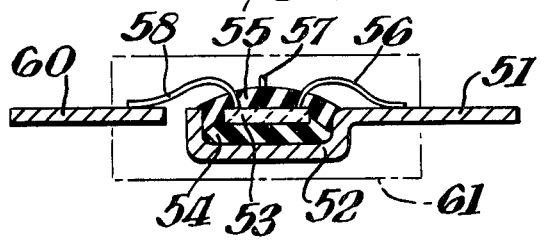
FIG. 6 shows an end sectional view of the package of FIG. 5 taken in plane 6—6.

In a second preferred embodiment of this invention illustrated in FIGS. 5 and 6, a metal lead 51 has a cup 52 formed at one end thereof. Within the cup 52 a hall-cell wafer 53 is sandwiched between resilient layers 54 and 55 which together completely envelop the wafer. Wire leads 56, 57 and 58 make connection between terminal pads (not shown) and the near ends of the three metal leads 51, 59 and 60, respectively. An insulative encapsulating housing material 61 is cast or molded about the cup and the near ends of the leads.

Figure 7:
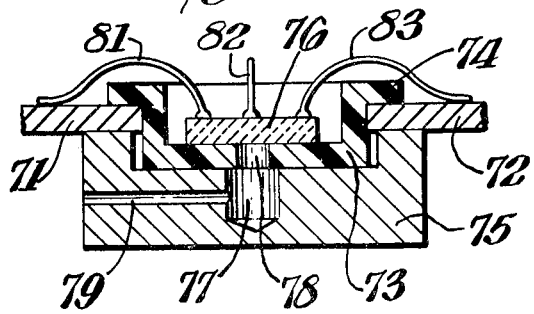
FIG. 7 shows in end sectional view a detail of partially completed hall-cell package of this invention abutting a fixture that aids in the wire to wafer attachment step.
Figure 8:
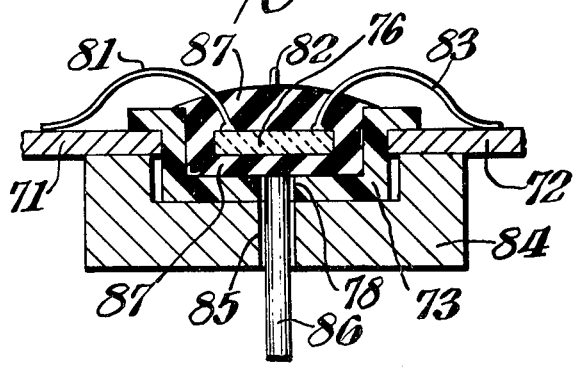
FIG. 8 shows in end sectional view a detail of the partially completed hall-cell package of FIG. 7 abutting another fixture that aids in the process of enveloping the wafer in a resilient cushion.

In FIGS. 7 and 8 there is illustrated a third preferred embodiment of this invention. A portion of two of the leads 71 and 72 are shown supporting an insulative cup 73. The cup has flanges 74 by which the leads more certainly register and hold the cup. If the cup is circular as that in FIG. 3, it may be desirable that the adjacent leads be provided with a circular indentation for further registering the cup there between. If the cup be rectangular as that in FIG. 5, then straight lead portions are more suitable for holding the cup. Furthermore if the leads are extensions from a lead frame, as has been above noted, a compressive spring tension between the leads may aid in firmly supporting the cup. Of course the cup may be bonded to the leads or to only one lead.

A tool or fixture 75 is placed flush against the outer bottom of the cup 73 and a hall-cell wafer 76 is placed in the cup or the cup bottom. The fixture 75 has a cavity 77 drilled therein that registers with a hole 78 in about the middle of the cup bottom. A hole 79 in the fixture leads from the cavity 77 to a side of the fixture so that a vacuum system (not shown) may be attached thereto for evacuating the cavity and holding the chip firmly in the bottom of the cup.

With the chip so held, the wire leads 81, 82 and 83 may be easily bonded to pads on the chip without inadvertent movement of the chip and with a solid backing being provided for the chip by the fixture. Such a solid backing is required for making thermo-compression or ultrasonic bonds. The bonder can then be moved over the adjacent lead end after a wire bond is made to a terminal pad and the wire-lead bond made immediately thereafter without losing touch with the very fine wire that is typically only about 0.001 inch in diameter.

The holding fixture 75 is now removed and another fixture 84 is placed flush against the bottom of the cup 73, as shown in FIG. 8. The fixture 84 has a vertical hole 85, as shown, that is registered with the hole 78 in the cup 73. A heated retractable pin 86 is mounted in the hole 85. Pin 86 is moved upward to lift the wire bonded wafer off the bottom of the cup, for example by 0.005 inch. The pin 86 being at about 100° C is then withdrawn and is positioned with its end flush with the bottom of the cup as shown. The wafer 76 remains elevated held by wires 81, 82 and 83 within the cup 73 during the following dispensing step. A resin 87 in liquid form, preferably a silicone rubber material, is dispensed from the top into the cup surrounding the wafer. The liquid resin portion that is adjacent to the end of the heated pin is cured so as to seal the hole 78 and to prevent flowing of the uncured resin through the hole 78. The fixture is then removed and the resin is conveniently oven cured throughout, providing a resilient protective covering 87 completely enveloping the wafer 76. A hard protective housing (not shown) is subsequently formed about the protected wafer as was described relative to the packages of FIGS. 3, 4, 5 and 6.

A number of experimental hall-cell packages of this invention were made. The integrated hall-cell circuit chip employed was the same as that described in the aforementioned U.S. Pat. No. 3,816,766 that is 0.006 inch thick. A lead frame of KOVAR as illustrated in FIGS. 3 and 4 herein was used and a ring of TEFLON (Tradename for tetrafluoroethylene of E.I. DuPont de Nemours) when bonded with epoxy to a wide portion of the lead frame formed a cup having 0.010 inch thick walls 0.015 inch high. The elastomeric silicone rubber was Dow Corning (Midland, Mich.) No. R-6101. The silicon rubber was cured for 2 hours at 70° C and in a second heating cycle at 150° C for 2 hours. The completed unit was molded in an epoxy resin, Morton 410-B (Morton-Norwich Products, Inc., Chicago, Ill.). The change in the sensitivity of the hall-cell chips was less than 2% after packaging, whereas conventionally packaged chips exhibit a sensitivity change typically an order of magnitude greater. At the same time, the overall thickness of these packages was only 0.080 inch making it possible to mount the packaged hall-cell chip very close to a magnetic pole piece or any other magnetic field source and without fear of altering the sensitivity due to mounting stresses.

What is claimed is:
1. A stress-free hall-cell package comprising:
   a. a semiconductor chip having a hall-cell formed therein and lying in one plane, said chip having conductive terminal pads on a surface thereof for providing electrical access to said hall-cell;
   b. at least three metal leads, an end portion of each of said leads lying in and defining another plane that is essentially parallel with said one plane;
   c. a cup abutting at least one of said metal leads;
   d. at least three metal wires each having one end connected to one of said terminal pads and another end connected to one of said leads near said end portion thereof;
   e. an insulative elastomeric protective covering being contained in said cup, and completely except at said one end of said wires; and
   f. an electrically insulating housing means for encapsulating and providing mechanical support to said cup and to said end portions of said leads.
2. The package of claim 1 wherein said semiconductor chip additionally includes an integrated circuit amplifier and an electrical coupling means for coupling the output of said hall-cell to the input of said amplifier, whereby a portion of said electrical access to said hall-cell is had through said amplifier.
3. The package of claim 1 wherein said at least three leads are essentially rectangular in cross-section and lie in the namely said another plane, having been cut from a standard lead frame.
4. The package of claim 1 wherein said cup has a hole in a bottom portion thereof.
5. The package of claim 1 wherein said cup abuts two of said leads, said cups having been capable of being entirely supported thereby during the assembly of said package.
6. The package of claim 1 wherein said cup is a metal extension of said at least one abutting lead.
7. The package of claim 1 wherein said cup is formed by a ring having been mounted on a metal extension of one of said leads, said lead extension serving as the bottom of said cup.

* * * * *

UNITED STATES PATENT OFFICE
CERTIFICATE OF CORRECTION

Patent No. 4,048,670    Dated September 13, 1977

Inventor(s) Hubert Eysermans

It is certified that error appears in the above-identified patent and that said Letters Patent are hereby corrected as shown below:

Cover page, under "[56] References Cited", the following two listed patents should be corrected to appear as:

-- 3,689,804     1/1972     Ishihama et al     174/52 PE
   3,706,840    12/1972     Moyle et al           29/588 --

Column 2, line 6, "silicon" should read -- silicone --

Column 5, line 50, "silicon" should read -- silicone --

Claim 1, line 15, after "completely" should appear

-- encompassing said clip --

Claim 3, line 3, before "namely" should appear -- same plane, --

Signed and Sealed this

Third Day of January 1978

[SEAL]

Attest:

RUTH C. MASON
*Attesting Officer*

LUTRELLE F. PARKER
*Acting Commissioner of Patents and Trademarks*